(12) United States Patent
Misawa et al.

(10) Patent No.: US 11,398,866 B2
(45) Date of Patent: Jul. 26, 2022

(54) OPTICAL SEMICONDUCTOR DEVICE, OPTICAL TRANSMISSION MODULE, AND OPTICAL TRANSCEIVER

(71) Applicant: SUMITOMO ELECTRIC INDUSTRIES, LTD., Osaka (JP)

(72) Inventors: Taichi Misawa, Osaka (JP); Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/314,429

(22) Filed: May 7, 2021

(65) Prior Publication Data

US 2021/0359761 A1 Nov. 18, 2021

(30) Foreign Application Priority Data

May 15, 2020 (JP) .............................. JP2020-086229

(51) Int. Cl.
*H04B 10/00* (2013.01)
*H04B 10/40* (2013.01)
*H04B 10/50* (2013.01)

(52) U.S. Cl.
CPC ........... *H04B 10/40* (2013.01); *H04B 10/503* (2013.01)

(58) Field of Classification Search
CPC .. H01S 5/02345; H01S 5/0261; H01S 5/0265; H01S 5/02325; H04B 10/501; H04B 10/40; H04B 10/503; G02F 1/0121; H01L 24/49
See application file for complete search history.

(56) References Cited

U.S. PATENT DOCUMENTS

| 5,781,578 | A * | 7/1998 | Takagi | G02F 1/0121 372/50.1 |
| 6,057,954 | A * | 5/2000 | Parayanthal | G02F 1/0327 372/38.1 |
| 9,726,914 | B2 * | 8/2017 | Nakamura | H01S 5/0265 |
| 10,334,717 | B2 * | 6/2019 | Noguchi | H05K 1/0274 |
| 2007/0248363 | A1 * | 10/2007 | Kagaya | H01S 5/02325 385/2 |
| 2014/0185638 | A1 * | 7/2014 | Tam | H01L 24/49 372/38.02 |
| 2019/0123251 | A1 * | 4/2019 | Neudecker | H01L 25/0753 |

FOREIGN PATENT DOCUMENTS

JP H05-037062 2/1993

* cited by examiner

*Primary Examiner* — Pranesh K Barua
(74) *Attorney, Agent, or Firm* — IPUSA, PLLC

(57) ABSTRACT

An optical semiconductor device includes an insulative base having first and second surfaces, and a metallic pattern formed on the first surface and including a grounding pattern, a transmission pattern having a line connected between input and output ends thereof, and first and second patterns, where the first pattern is located between the second surface crossing a direction parallel to the first surface, and the second pattern. The device includes a laser chip, mounted on the first surface between the transmission pattern and the first and second patterns, and having an electrode and a light emitting end located between the electrode and the second surface, a first wire connecting the output end to the electrode, a second wire connecting the electrode to the first pattern, an inductor provided on the first surface connected between the first and second patterns and formed by a meander wiring or a bonding wire.

16 Claims, 16 Drawing Sheets

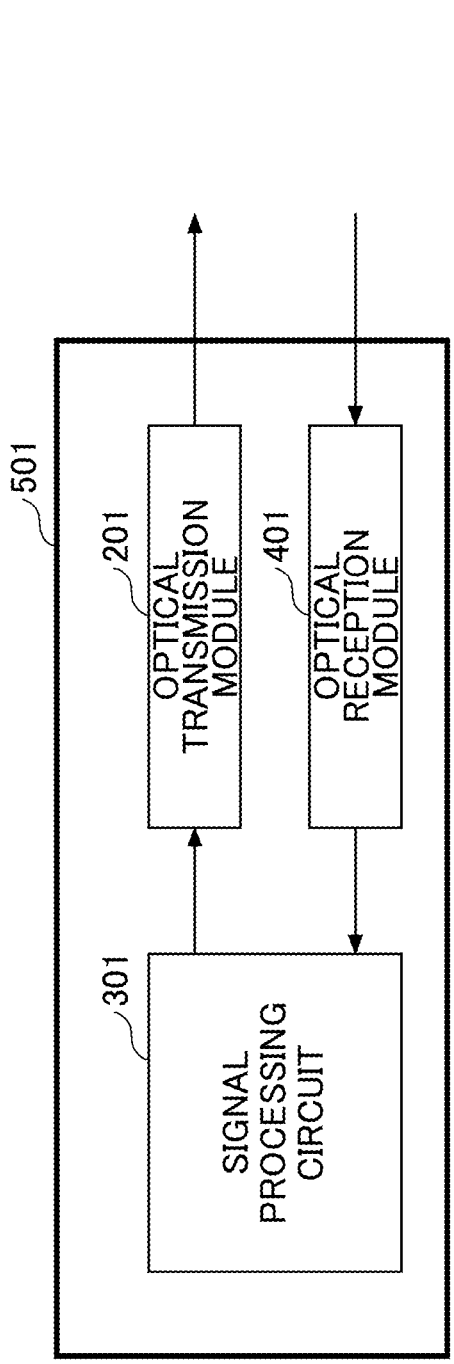
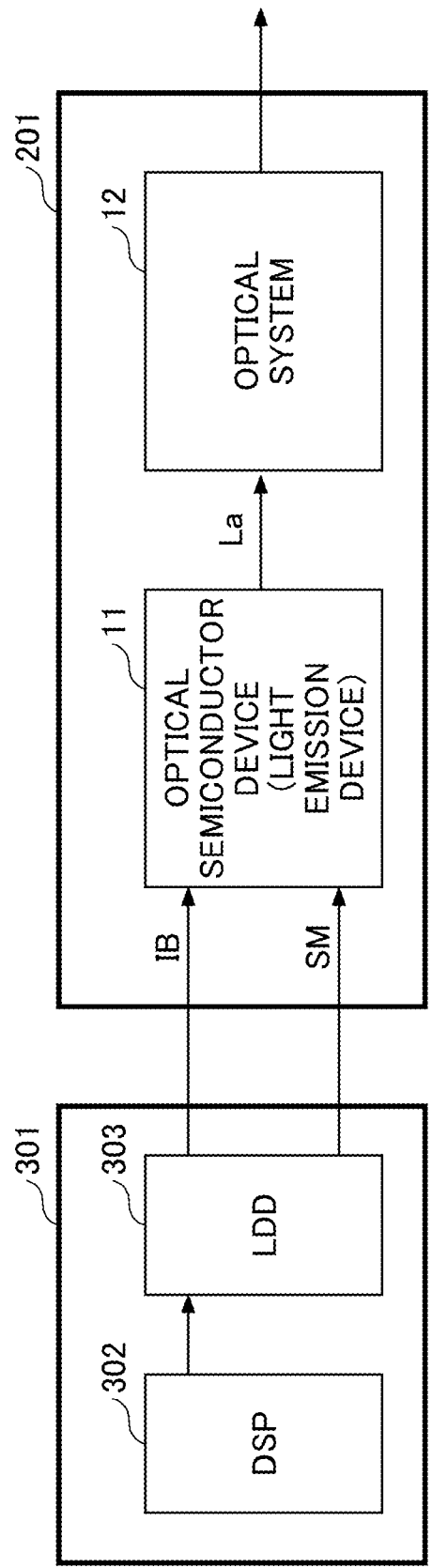

OPTICAL SEMICONDUCTOR DEVICE, OPTICAL TRANSMISSION MODULE, AND OPTICAL TRANSCEIVER

CROSS-REFERENCE TO RELATED APPLICATIONS

This application is based upon and claims priority to Japanese Patent Application No. 2020-086229 filed on May 15, 2020, the entire contents of which are incorporated herein by reference.

BACKGROUND OF THE INVENTION

1. Field of the Invention

Embodiments of the present disclosure are related to optical semiconductor devices, optical transmission modules, and optical transceivers.

2. Description of the Related Art

Optical semiconductor devices used in optical transmitters require a high-frequency transmission signal to be transmitted to a laser diode or an optical modulator, in order to generate an optical signal. For this reason, signal waveguides, such as coplanar strips and microstrip lines, are used. For example, semiconductor laser modules including microstrip lines for transmitting high-frequency driving signals to semiconductor lasers, are known.

SUMMARY OF THE INVENTION

According to one aspect of the embodiments of the present disclosure, an optical semiconductor device includes
an insulative base having a first surface and a second surface, the first surface being parallel to a first direction, the second surface crossing the first direction, the insulative base including a metallic pattern formed on the first surface, the metallic pattern including
a grounding pattern configured to be grounded,
a transmission pattern having an input end, an output end, and a line electrically connected between the input end and the output end,
a first pattern, and
a second pattern,
wherein the first pattern is located between the second surface and the second pattern;
a semiconductor laser chip mounted on the first surface, the semiconductor chip having an electrode, and an emitting end located between the electrode and the second surface, the semiconductor laser chip being configured to emit an optical signal from the emitting end according to an electrical signal input to the electrode, the semiconductor laser chip being located between the transmission pattern and two patterns formed by the first pattern and the second pattern, respectively;
a first wire electrically connecting the output end of the transmission pattern to the electrode;
a second wire electrically connecting the electrode of the semiconductor laser chip to the first pattern;
an inductor provided on the first surface, the inductor being electrically connected between the first pattern and the second pattern, the inductor being formed by a meander wiring or a bonding wire;
a resistor provided on the first surface; and
a capacitor provided on the first surface;
wherein the resistor is electrically connected between the second pattern and the capacitor, and
wherein the capacitor is electrically connected between the resistor and the grounding pattern.

According to another aspect of the embodiments of the present disclosure, an optical transmission module includes
the optical semiconductor device described immediately above; and
an optical system configured to receive the optical signal and output an optical signal corresponding to the input optical signal.

According to still another aspect of the embodiments of the present disclosure, an optical transceiver includes
the optical transmission module described immediately above;
an optical reception module configured to convert an optical signal input from an external source into a received signal; and
a signal processing circuit configured to supply the electrical signal to the input end and process the received signal.

Other objects and further features of the present disclosure will be apparent from the following detailed description when read in conjunction with the accompanying drawings.

BRIEF DESCRIPTION OF THE DRAWINGS

FIG. 1 is a block diagram illustrating an example of a configuration of an optical transceiver according to one embodiment.

FIG. 2 is a block diagram illustrating an example of a configuration of a signal processing circuit and an optical transmission module according to one embodiment.

DESCRIPTION OF THE EMBODIMENTS

Figure 3:
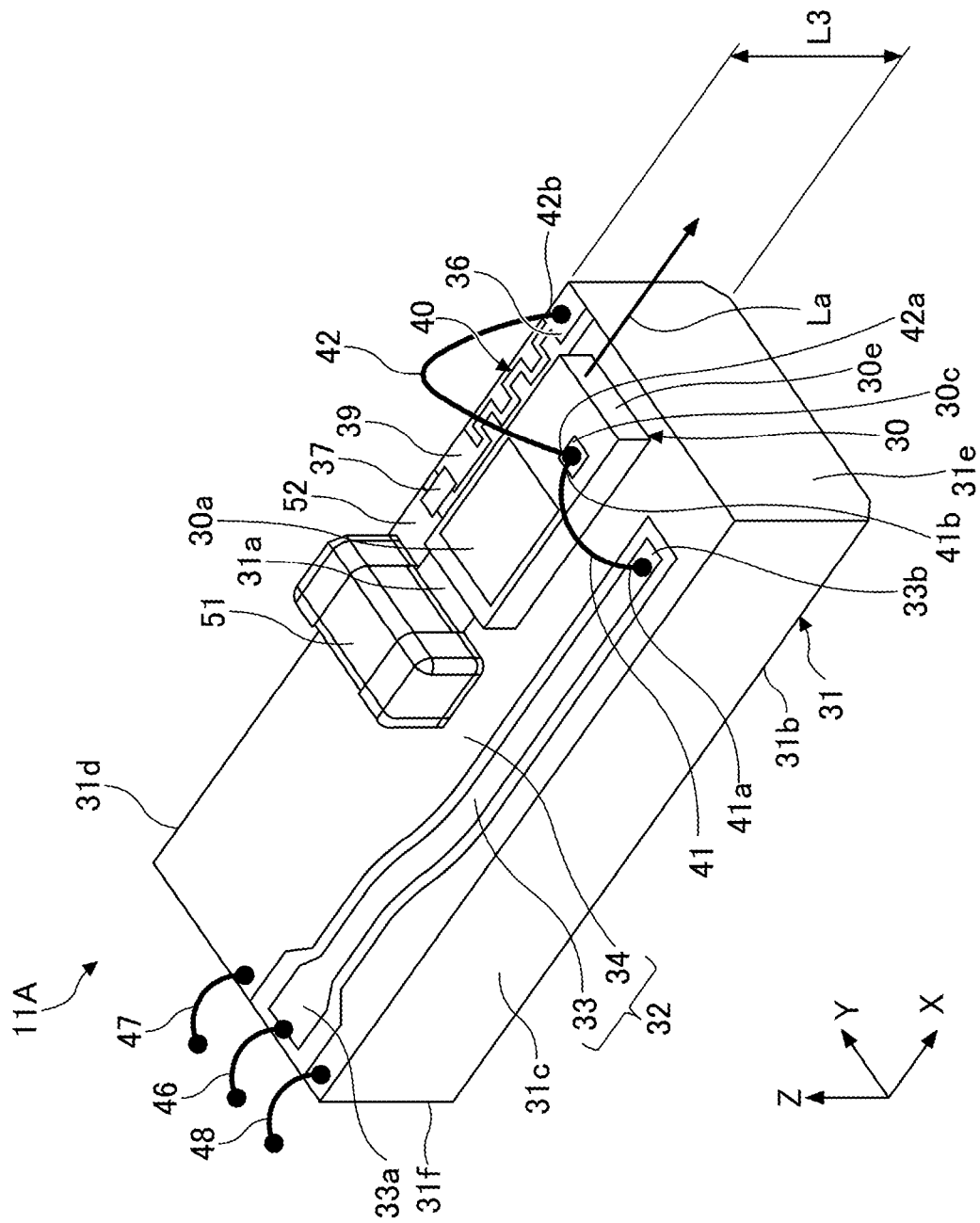
FIG. 3 is a perspective view illustrating an example of a configuration of an optical semiconductor device according to a first embodiment.

Next, examples of optical semiconductor devices, optical transmission modules, and optical transceivers according to embodiments of the present disclosure will be described with reference to the drawings. The present disclosure is not limited to these embodiments, and various variations, modifications, and substitutions may be made without departing from the scope of the present disclosure.

[Details of Optical transceiver According to One Embodiment]

FIG. 1 is a block diagram illustrating an example of a configuration of an optical transceiver according to one embodiment. An optical transceiver 501 illustrated in FIG. 1 is a device which transmits and receives optical signals. For example, the optical transceiver 501 is connected to one end of an optical fiber, and communicates optically via the optical fiber with another optical transceiver which is connected to the other end of the optical fiber. The optical transceiver 501 may include an optical transmission module 201, an optical reception module 401, and a signal processing circuit 301, for example.

The optical transmission module 201 may be a Transmitter Optical Sub Assembly (TOSA) which converts an electrical signal (or transmission signal) into an optical signal and transmits the converted optical signal outside the optical transceiver 501, for example. The optical reception module 401 may be a Receiver Optical Sub Assembly (ROSA) which converts the optical signal input from the outside of the optical transceiver 501 into an electrical signal (or reception signal), for example. The signal processing circuit 301 supplies the transmission signal to the optical transmission module 201, and receives the reception signal from the optical reception module 401. The signal processing circuit 301 may be a Clock and Data Recovery (CDR) circuit, for example.

[Details of Signal Processing Circuit and Light Transmission Module in One Embodiment]

FIG. 2 is a block diagram illustrating an example of a configuration of the signal processing circuit and the optical transmission module according to one embodiment. In FIG. 2, the signal processing circuit 301 includes a Digital Signal Processor (DSP) 302, and a Laser Diode Driver (LDD) 303, for example. The optical transmission module 201 includes an optical semiconductor device 11, and an optical system 12, for example.

The DSP 302 may be a circuit which generates an electrical signal (or transmission signal) including information (or transmission information) to be transmitted, and supplies the electrical signal (or transmission signal) to the LDD 303. The DSP 302 may be an integrated circuit for signal processing, for example. The LDD 303 may be a driving circuit which supplies a driving signal IB to the optical semiconductor device 11. The optical semiconductor device 11 may include a semiconductor laser, and an optical modulator, for example. The semiconductor laser outputs an optical signal according to the driving signal IB. The driving signal IB may be a DC bias current for oscillating the semiconductor laser, for example. The LDD 303 amplifies the electrical signal supplied from the DSP 302, and supplies an amplified modulation signal SM to the optical semiconductor device 11. The modulation signal SM is a high-frequency signal including the transmission information. For example, the modulation signal SM is input to the optical modulator which modulates the optical signal output from the semiconductor laser according to the modulation signal SM, and a modulated optical signal (or optical transmission signal) is output from the optical modulator. In this case, the driving signal IB may be a DC current, and the semiconductor laser may output Continuous Wave (CW) light as the optical signal, for example. The optical modulator modulates the CW light according to the modulation signal SM, and outputs the modulated optical signal. The driving signal IB may be generated by a circuit (for example, a current source) other than the LDD 303, and supplied to the optical semiconductor device 11. The optical semiconductor device 11 may be configured so that the semiconductor laser generates the optical transmission signal according to the driving signal IB and the modulation signal SM. In this case, the driving signal IB may be a DC bias current, and the modulation signal SM may be a high-speed drive current, for example. The DSP 302 may receive the electrical signal which is generated by the optical reception module 401 according to the optical signal (or optical reception signal) received by the optical transceiver 501 from the outside. The DSP 302 may subject the electrical signal supplied from the optical reception module 401 to a signal processing, and generate the electrical signal (or reception signal) including the information (or reception information) to be received. The received signal may be supplied to the inside of a host device which is mounted with the optical transceiver 501, for example.

The optical semiconductor device 11 functions as a light source (or light emitting device) that is driven by the driving signal IB and the modulation signal SM, to output an optical signal (or light) La. The optical signal La is the light generated according to the driving signal IB and the modulation signal SM. As described above, the CW light may be generated by the driving signal IB, and the CW light may be modulated by the optical modulator according to the modulation signal SM, to generate the optical signal La. The optical system 12 may be a mechanism which includes a lens that receives the optical signal La from the optical semiconductor device 11, and transmits an optical signal corresponding to the input (or received) optical signal La to the outside (for example, an optical fiber) of the optical transmission module 201. For example, the optical system 12 may include a lens that converges the input optical signal La onto an end surface of the optical fiber.

[Details of Optical Semiconductor Device According to First Embodiment]

Figure 4:
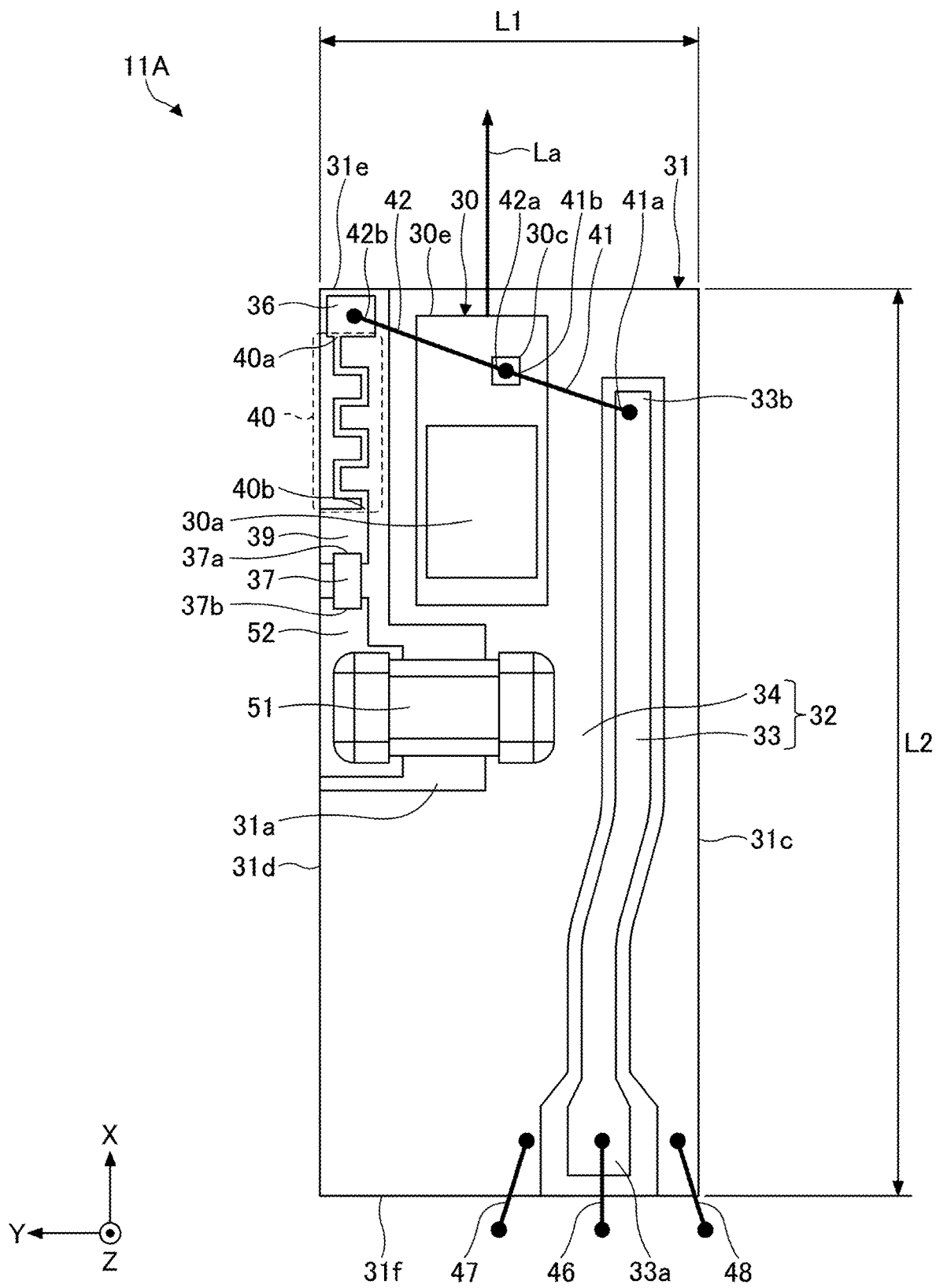
FIG. 4 is a plan view illustrating the example of the configuration of the optical semiconductor device according to the first embodiment.
Figure 5:
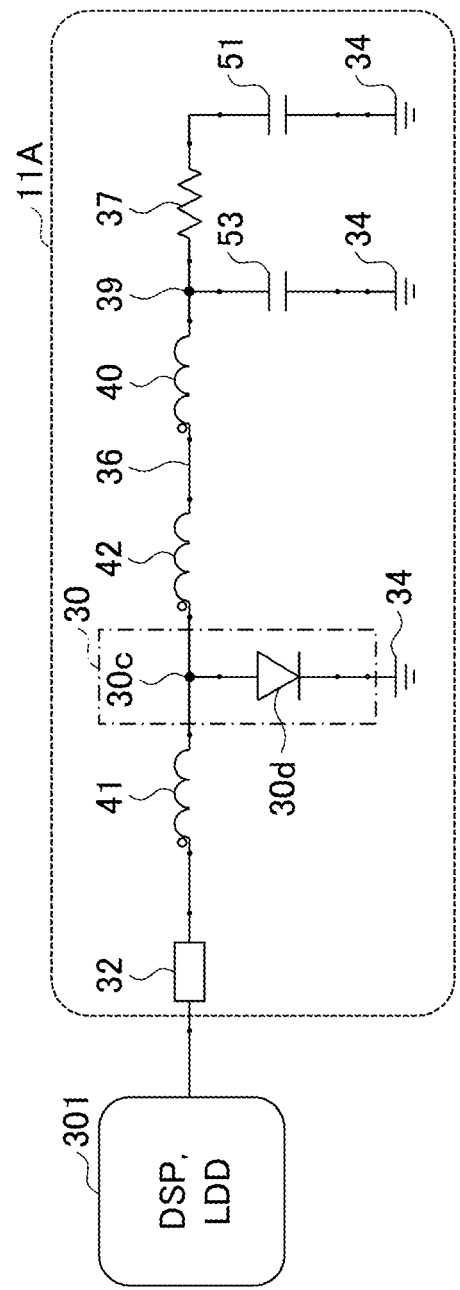
FIG. 5 is a circuit diagram illustrating the example of the configuration of the optical semiconductor device according to the first embodiment.

FIG. 3 is a perspective view illustrating an example of a configuration of the optical semiconductor device according to a first embodiment. FIG. 4 is a plan view illustrating the example of the configuration of the optical semiconductor device according to the first embodiment. FIG. 5 is a circuit diagram illustrating the example of the configuration of the optical semiconductor device according to the first embodiment. The configuration of the optical semiconductor device according to the first embodiment will be described, by referring to FIG. 3, FIG. 4, and FIG. 5.

For the sake of facilitating the understanding, the scale of each member in the drawings may differ from the actual scale. In this specification, three axis directions (that is, X-axis direction, Y-axis direction, and Z-axis direction) of a three-dimensional orthogonal coordinate system is used for the description, and a longitudinal direction of a carrier 31 is regarded as the X-axis direction, a width direction of the carrier 31 is regarded as the Y-axis direction, and a height direction (or thickness direction) of the carrier 31 is regarded as the Z-axis direction.

Directions such as parallel, perpendicular, orthogonal, horizontal, vertical, up and down, left and right, or the like, may tolerate deviations to a certain extent that do not impair or deteriorate effects of the disclosed technique. The X-axis direction, the Y-axis direction, and the Z-axis direction represent a direction parallel to the X-axis, a direction parallel to the Y-axis, and a direction parallel to the Z-axis, respectively. The X-axis direction and the Y-axis direction are orthogonal to each other. The Y-axis direction and the Z-axis direction are orthogonal to each other. The Z-axis direction and the X-axis direction are orthogonal to each other. An XY-plane, a YZ-plane, and a ZX-plane represent a virtual plane parallel to the X-axis direction and the Y-axis direction, a virtual plane parallel to the Y-axis direction and the Z-axis direction, and a virtual plane parallel to the Z-axis direction and the X-axis direction, respectively.

An optical semiconductor device 11A illustrated in FIG. 3, FIG. 4, and FIG. 5 is an example of the optical semiconductor device 11 described above. The optical semiconductor device 11A is a light emitting device which emits the optical signal La from a light emission end (or facet) 30e. The optical signal La may be emitted from the light emission end 30e in a positive X-axis direction, for example. An optical axis of the optical signal La may be the X-axis direction, for example. The optical axis of the optical signal La may not perfectly match the X-axis direction, and may tolerate a deviation to a certain extent that does not impair or deteriorate the effects of the disclosed technique. The optical semiconductor device 11A may include the carrier 31, a semiconductor laser chip 30, a first bonding wire 41, a second bonding wire 42, an inductor 40, a resistor 37, and a capacitor 51. The first bonding wire 41 is an example of a first wire, and the second bonding wire 42 is an example of a second wire. The inductor 40 is an example of a meander wiring.

The carrier 31 is an example of an insulative base having a rectangular parallelepiped external shape. The carrier 31 may sometimes also be referred to as a base. The carrier 31 may have a rectangular parallelepiped external shape that extends in the longitudinal direction (or first direction). The rectangular parallelepiped shape may include generally rectangular parallelepiped shapes, and rectangular parallelepiped shapes having sides or corners that are chamfered, for example. The carrier 31 is made of a material that includes an insulating material, such as ceramics, glass, or the like, as a main component thereof. However, the carrier 31 may include a conductive portion (for example, an internal layer pattern, a via, or the like).

The carrier 31 may include, in the parallelepiped external shape, a parallelepiped body having a main (or principal) surface 31a, a back surface 31b, a pair of side surfaces 31c and 31d, and a pair of end surfaces 31e and 31f, for example. The main surface 31a is an example of a first surface parallel to the first direction. The first side may further be parallel to the width direction (or Y-axis direction). The back surface 31b is the surface opposite the main surface 31a along the height direction (or Z-axis direction). The pair of side surfaces 31c and 31d are arranged to face mutually opposite directions along a lateral direction (or Y-axis direction). The pair of end surfaces 31e and 31f are arranged to face mutually opposite directions along the longitudinal direction (or X-axis direction). The end surface 31e is an example of a second surface that is adjacent to the first surface and crosses the first direction. The end surface 31e is perpendicular to the first direction, for example.

The carrier 31 may include a conductive circuit pattern (or metallic pattern) formed on the main surface 31a. In this example, the conductive circuit pattern formed on the main surface 31a includes a coplanar strip (or transmission pattern, or interconnect pattern) 32, a first pattern 36, a second pattern 39, and a third pattern 52. The carrier 31 may include a circuit pattern (or metallic pattern) on at least one of the back surface 31b, the side surfaces 31c and 31d, and the end surfaces 31e and 31f.

The coplanar strip 32 is a waveguide extending in the longitudinal direction of the carrier 31, for example. One end of the coplanar strip 32 is electrically connected to the semiconductor laser chip 30, to supply the modulation signal SM to the semiconductor laser chip 30. More particularly, the coplanar strip 32 includes an input end 33a, an output end 33b, and a wiring pattern (or signal line) 33 connected between the input end 33a and the output end 33b. The coplanar strip 32 is an example of an interconnect pattern that transmits the modulation signal SM input to the input end 33a to the output end 33b via the wiring pattern 33. The coplanar strip 32 may be a transmission line that is formed of the wiring pattern 33 disposed with a predetermined separation (or gap) from a grounding pattern (a portion of a grounding pattern 34 in this example) that is electrically connected to a ground potential. By utilizing a portion of the grounding pattern 34 as a ground plane of the coplanar strip 32, it is possible to effectively utilize the limited area of the grounding pattern 34, thereby enabling the size of the optical semiconductor device 11A to be further reduced. On the main surface 31a, the wiring pattern 33 is surrounded by the grounding pattern 34, and is disposed with a gap from the surrounding grounding pattern 34, thereby insulating the wiring pattern 33 from the grounding pattern 34. For example, a characteristic impedance of the coplanar strip 32 can be varied by varying the size of the gap between the grounding pattern 34 and the wiring pattern 33.

The grounding pattern 34 is an example of a conductive pattern that is electrically connected to the ground potential. The grounding pattern 34 may be a part of the conductive circuit pattern formed on the main surface 31a, for example. The grounding pattern 34 may be a conductive metallic film, formed on the main surface 31a of the carrier 31, and electrically connected to a reference potential, such as the ground potential. In this example, the grounding pattern 34 is provided on substantially the entire area of the main surface 31a, except for areas where the wiring pattern (wiring) 33, the first pattern 36, the inductor (meander wiring) 40, the second pattern 39, and a third pattern 52 are to be formed. The grounding pattern 34 may be separated into a plurality of segments, instead of being formed by a single pattern. A bonding wire 47 may connect the grounding pattern 34 and a grounding pattern of the optical transmission module 201 to each other, on one side of the input end 33a of the coplanar strip 32 along the Y-axis direction. A bonding wire 48 may connect the grounding pattern 34 and the grounding pattern of the optical transmission module 201 to each other, on the other side of the input end 33a of the wiring pattern 33 along the Y-axis direction. For example, the grounding pattern 34 may be electrically connected to a grounding pattern or a grounding terminal of a package (not illustrated) of the optical transmission module 201 which accommodates the optical semiconductor device 11A, via bonding wires 47 and 48.

The wiring pattern 33 may be a conductive metallic film that guides the modulation signal SM. The wiring pattern 33 extends in the X-axis direction from a position near one end surface 31f of the carrier 31 to a position near the other end surface 31e (second surface). More particularly, the wiring pattern 33 extends in the first direction (positive X-axis direction in this example) from the input end 33a to the output end 33b. The wiring pattern 33 electrically connects the input end 33a to the output end 33b. The wiring pattern 33 may include not only a linear portion parallel to the first direction, but may include a portion that is partially non-parallel to the first direction.

A portion of the wiring pattern 33 positioned near the end surface 31f may be the input end 33a, for example. The input end 33a may be a pad to be used for wire bonding, for example. A bonding wire 46 may electrically connect the input end 33a to an external input terminal of the package of optical transmission module 201, for example. The modulation signal SM may be input to the input end 33a from the signal processing circuit 301, via the external input terminal and the bonding wire 46, for example. The input end 33a may have a sufficiently large area that is required to bond a tip end of the bonding wire 46 thereon, for example. The input end 33a may be a conductive metallic film, similar to the wiring pattern 33. The input end 33a is adjacent to the grounding pattern 34 via a gap. When the optical semiconductor device 11A is viewed in the Z-axis direction (that is, in a plan view of the main surface 31a), the grounding pattern 34 may be formed so as not to cross the bonding wire 46.

A portion of the wiring pattern 33 positioned near the end surface 31e may be the output end 33b that is disposed between the input end 33a and the end surface 31e. The output end 33b may be a pad to be used for wire bonding. The output end 33b may be electrically connected to the input end 33a via the wiring pattern 33. The output end 33b may be a conductive metallic film, similar to the wiring pattern 33.

The semiconductor laser chip 30 may be a semiconductor optical integrated device having a monolithic structure in which a laser diode (not illustrated) and a semiconductor optical modulator 30d (refer to FIG. 5) are integrated on a semiconductor substrate. The semiconductor laser chip 30 may sometimes also be referred to as an Electro-Absorption Modulated Laser (EML) chip. The semiconductor laser chip 30 may include a pad 30a, a pad 30c, a back electrode which will be described later, and the light emission end 30e, for example. The pad 30a may be an electrode connected to an anode electrode of the laser diode, for example. The pad 30c may be an electrode connected to an anode electrode of the semiconductor optical modulator 30d, for example. The semiconductor laser chip 30 emits the optical signal La from the light emission end 30e. The optical signal La is emitted in the X-axis direction, for example. Accordingly, the optical axis of the optical signal La may coincide with the X-axis direction. An angular deviation of the optical axis of the optical signal La with respect to the X-axis direction may be tolerated to a certain extent that does not impair or deteriorate the effects of the disclosed technique, so that it is possible to obtain an optical coupling between the optical semiconductor device 11A and the optical system 12 having a coupling efficiency higher than or equal to a predetermined efficiency, or the like.

The pad 30a may receive a DC bias current, for example. The DC bias current is a DC current for causing the laser diode to generate laser light. This DC bias current corresponds to the driving signal IB supplied from the LDD 303 of the signal processing circuit 301 via wires and bonding wires that are not illustrated, for example. The pad 30c may receive the high-frequency modulation signal SM, for example. These pads 30a and 30c may be formed on a semiconductor substrate by gold plating, for example. The semiconductor laser chip 30 may be mounted on the grounding pattern 34 formed on the main surface 31a, at a position near the one end surface 31e along the longitudinal direction of the carrier 31. In other words, the back electrode (or cathode electrode) formed on the back of the semiconductor laser chip 30, which is common to the laser diode and the semiconductor optical modulator 30d of the semiconductor laser chip 30, is bonded to the grounding pattern 34 via a conductive adhesive such as solder or the like. The conductive adhesive may include gold tin (AuSn), for example. Hence, the back electrode is electrically connected to the grounding pattern 34, and the semiconductor laser chip 30 is mounted on the main surface 31a of the carrier 31.

The semiconductor laser chip 30 may generate the optical signal La according to the modulation signal SM that is input to the pad 30c. The semiconductor laser chip 30 may output the generated optical signal La from the light emission end 30e in the positive X-axis direction. As described above, the optical axis of the optical signal La may be inclined with respect to the X-axis direction to a certain extent that does not impair or deteriorate the effects of the disclosed technique. The modulation signal SM is an example of an electrical signal that is input to the pad 30c. The pad 30c is an example of a signal electrode.

The first bonding wire 41 may connect the output end 33b of the coplanar strip 32 and the pad 30c of the semiconductor laser chip 30 to each other. The first bonding wire 41 may be made of a conductive material, such as gold (Au) or the like, for example. The first bonding wire 41 may transmit the modulation signal SM from the output end 33b to the pad 30c. The first bonding wire 41 may include a first end 41a connected to the output end 33b, and a second end 41b connected to the pad 30c. The pad 30c may have a sufficiently large area that is required to bond the second end 41b of the first bonding wire 46 thereon.

The second bonding wire 42 may connect the pad 30c and the first pattern 36 to each other. The second bonding wire 42 may be made of a conductive material, such as gold (Au) or the like, for example. The first bonding wire 41 may be used to electrically terminate the modulation signal SM by the resistor 37 which will be described later. The second bonding wire 42 may include a third end 42a connected to the pad 30c, and a fourth end 42b connected to the first pattern 36.

The first pattern 36 may be a conductive pattern disposed opposite the output end 33b of the coplanar strip 32, with respect to the semiconductor laser chip 30. Alternatively, the semiconductor laser chip 30 may be positioned between the coplanar strip 32 and the first pattern 36 on the main surface 31a. The first pattern 36 may be a pad for connecting a circuit formed on the main surface 31a and the pad 30c by wire bonding, for example. The pad 30c may be positioned between the output end 33b and the first pattern 36 on the main surface 31a, for example.

The second pattern 39 may be a conductive pattern disposed opposite the output end 33b of the coplanar strip 32 with respect to the semiconductor laser chip 30, and opposite the end surface 31e with respect to the first pattern 36. Alternatively, the semiconductor laser chip 30 may be positioned between the coplanar strip 32 and two patterns (first pattern 36 and second pattern 39) on the main surface 31a. The first pattern 36 may be positioned between the second pattern 39 and the end surface 31e on the main surface 31a. The second pattern 39 may be a pattern that connects the inductor 40 or a bonding wire which will be described later, to the resistor 37.

The inductor 40 is an example of the meander wiring provided on the first surface. The inductor 40 includes a fifth end 40a electrically connected to the first pattern 36, and a sixth end 40b electrically connected to the second pattern 39. The inductor 40 may include a meander-shaped wire including hairpin turns. The inductor 40 extends in the X-axis direction from the first pattern 36 to the second pattern 39, and may be a conductive wiring pattern formed on the main surface 31a. For example, the fifth end 40a and the sixth end 40b may be disposed along the X-axis direction. The inductor 40 may include a plurality of rectangular wave-like undulating wiring patterns including hairpin turns, extending in the Y-axis direction. An inductance of the inductor 40 may be varied by varying the number of rectangular wave-like undulating wiring patterns and the length of each rectangular wave-like undulating wiring pattern, for example.

The resistor 37 is an example of a resistive element provided on the first surface. The resistor 37 may include a seventh end 37a, and an eighth end 37b. The seventh end 37a may be electrically connected to the second pattern 39. The eighth end 37b may be electrically connected to the grounding pattern 34 via the capacitor 51. Accordingly, the resistor 37 may be electrically connected between the second pattern 39 and the capacitor 51. The eighth end 37b may be electrically connected to the third pattern 52. The resistor 37 may be surface mounted on the first surface by solder reflow, for example, in order to make these electrical connections and also fix the resistor 37 on carrier 31. More particularly, the seventh end 37a is bonded to the second pattern 39 by a solder material, and the eighth end 37b is bonded to the third pattern 52 by a solder material. The resistor 37 may be any of a chip resistor, a thin film resistor, and other types of devices having a resistance value, for example. In the case of the thin film resistor, a conductive film may be formed directly on the main surface 31a by deposition, for example. The thin film resistor does not require the bonding using the solder material.

The resistor 37 may function as a terminating resistor of the coplanar strip 32. A resistance value of the resistor 37 may be greater than the value of a characteristic impedance value (for example, 50Ω) of the coplanar strip 32, for example.

The capacitor 51 is an example of a capacitor provided on the first surface. In this example, the capacitor 51 has a rectangular shape that extends in the longitudinal direction, for example. The capacitor 51 may be disposed on the main surface 31a, so that the longitudinal direction of the capacitor 51 is parallel to the Y-axis direction, for example. The capacitor 51 may include one end electrically connected to the third pattern 52, and the other end electrically connected to the grounding pattern 34. Accordingly, capacitor 51 may be electrically connected between the resistor 37 and the grounding pattern 34. The coplanar strip 32, which transmits the high-frequency modulation signal SM, is terminated to the ground potential via the resistor 37 and the capacitor 51.

Figure 6:
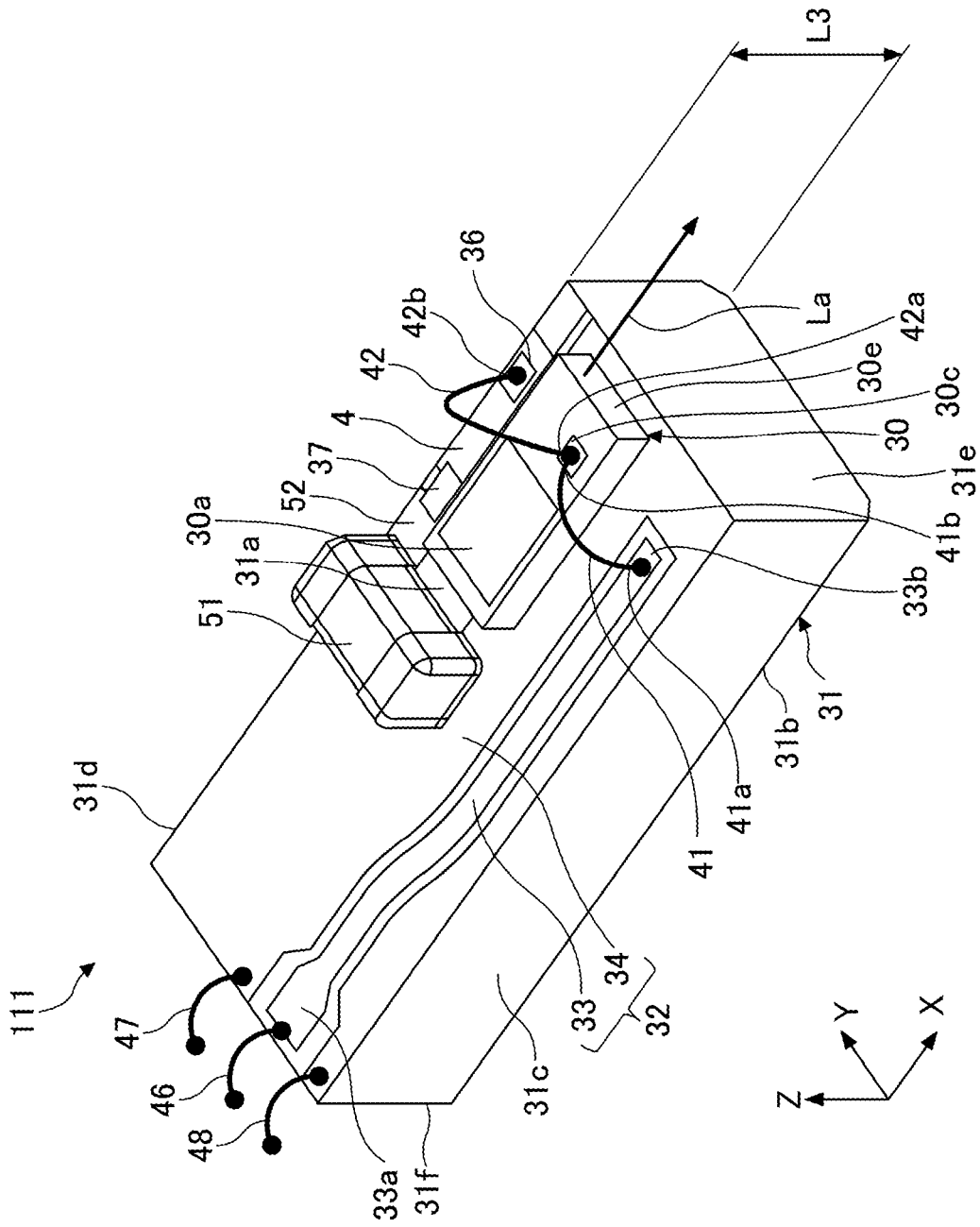
FIG. 6 is a perspective view illustrating an example of a configuration of an optical semiconductor device according to one comparative example.
Figure 7:
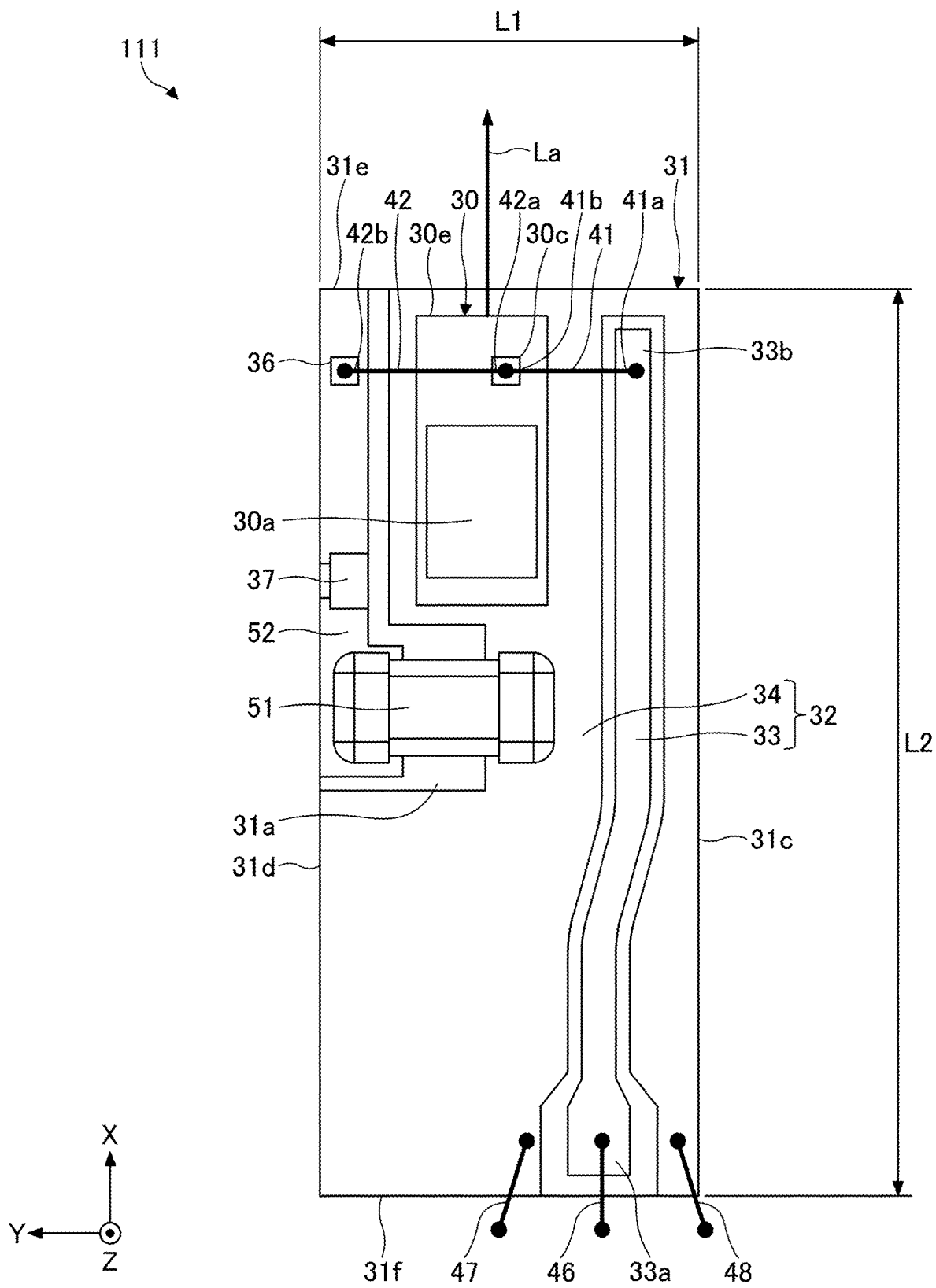
FIG. 7 is a plan view illustrating the example of the configuration of the optical semiconductor device according to one comparative example.
Figure 8:
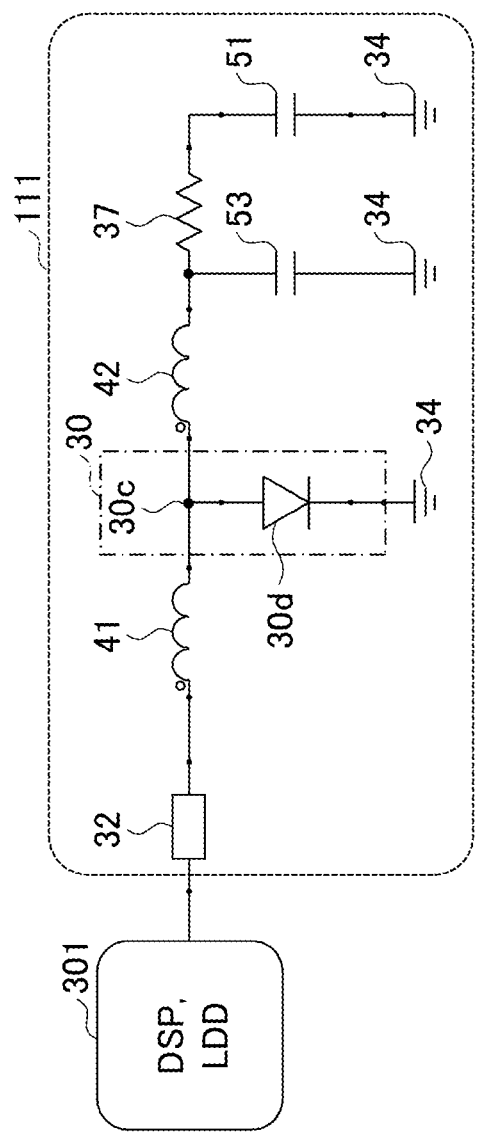
FIG. 8 is a circuit diagram illustrating the example of the configuration of the optical semiconductor device according to one comparative example.

Accordingly, in the optical semiconductor device 11A, the inductance of the wiring between the second bonding wire 42 and the resistor 37 can be increased, by providing the inductor 40 between the second bonding wire 42 and the resistor 37. Hence, the inductance of the wiring between the second bonding wire 42 and the resistor 37 in the optical semiconductor device 11A increases compared to that of an optical semiconductor device 111 according to one comparative example in which a wiring 4 between the second bonding wire 42 and the resistor 37 is linear, as illustrated in FIG. 6, FIG. 7, and FIG. 8, for example. Accordingly, by employing the inductor 40, it is possible to secure a high inductance between the second bonding wire 42 and the resistor 37, even if an area sandwiched between the first pattern 36 and the second pattern 39 is relatively narrow. Because the inductance of the wiring is increased by the inductor 40, an amplitude of the modulation signal SM input to the pad 30c of the semiconductor laser chip 30 can be increased within a desired frequency range. This effect of increasing the amplitude of the modulation signal SM corresponds to peaking that improves the bandwidth in a frequency domain where the intensity of particularly the high-frequency signal begins to decrease, in frequency characteristics of the high-frequency signal. Hence, it is possible to provide a broadband optical semiconductor device 11A, a broadband optical transmission module 201, and a broadband optical transceiver 501, by reducing attenuation in the high-frequency band of the modulation signal SM input to the semiconductor laser chip 30.

In addition, as illustrated in FIG. 4, in the optical semiconductor device 11A, a distance between the first pattern 36 and the end surface 31e is shorter than a distance between the pad 30c and the end surface 31e. Thus, in the X-axis direction, a distance between the first pattern 36 and the second pattern 39 becomes long compared to a case where the distance between the first pattern 36 and the end surface 31e is longer than the distance between the pad 30c and the end surface 31e, or a case where both the first pattern 36 and the pad 30c are separated from the end surface 31e by approximately the same distance (refer to FIG. 7). The longer distance between the first pattern 36 and the second pattern 39 enables the inductance of the connecting wiring between the second bonding wire 42 and the resistor 37 to be increased.

Further, along the X-axis direction of the optical semiconductor device 11A, the distance between the pad 30c and the end surface 31e is shorter than the distance between the output end 33b and the end surface 31e, as illustrated in FIG. 4. For this reason, the positional relationship of three positions, namely, a center portion of the first pattern 36, a center portion of the pad 30c, and a center portion of the output end 33b, does not represent a V-shape which curves at the center position of the pad 30c, but approaches a linear arrangement. Hence, the bonding of the first bonding wire 41 and the second bonding wire 42 by a wire bonding device can be facilitated, and a wire bonding time can be reduced. As illustrated in FIG. 4, according to the optical semiconductor device 11A, in the plan view of the main surface 31a, the center portion of the first pattern 36, the center portion of the pad 30c, and the center portion of the output end 33b are arranged linearly. Thus, the bonding of the first bonding wire 41 can be followed by the bonding of the second bonding wire 42, thereby reducing the wire bonding time.

In order to reduce the power consumption of the signal processing circuit 301, it is effective to reduce a driving amplitude (amplitude of the signal output from the DSP 302 or LDD 303) of the DSP 302 or the LDD 303, for example. When a voltage amplitude of a signal is reduced, for example, a power supply voltage of the circuit which generates the signal can be reduced, thereby enabling the power consumption to be reduced. According to one method, by increasing the resistance value of a terminating resistor (for example, the resistor 37), the amplitude of the modulation signal SM can be secured (or increased) even if a driving capability of the DSP 302 or the LDD 303 is reduced. On the other hand, the inductance of the second bonding wire 42 on the terminating end can cause the peaking of the frequency characteristics, thereby broadening the band that can be processed. However, increasing the resistance value of the terminating resistor weakens the peaking caused by the inductance of the second bonding wire 42, thereby reducing the band of modulation signal SM input to the pad 30c of the semiconductor laser chip 30. For this reason, as the resistance value of the terminating resistor increases, the inductance on the termination end needs to be increased in order to secure the band that can be processed. However, the inductance of the second bonding wire 42 depends on the length of the wire, and in actual practice, may be approximately 600 pH at the most, for example. Because the size of the carrier 31 is limited to a size with a width L1 of approximately 0.7 mm at the most, for example, which enables integration into and mounting onto the optical transmission module 201, it may be difficult to mount an inductor element, such as a chip coil or the like.

On the contrary, in the optical semiconductor device 11A according to the first embodiment, the inductance between the semiconductor laser chip 30 and the terminating resistor 37 can be increased, by combining the inductance of the inductor 40 and the inductance of the second bonding wire 42. Accordingly, in a carrier structure having a small size, the high frequency band can be maintained, even if the resistance value of the terminating resistor is increased. In addition, because the resistance value of the terminating resistor can be increased, the driving capability of the DSP 302 or the LDD 303 can be reduced, thereby enabling the power consumption of the signal processing circuit 301 to be reduced. When the resistance value of the terminating resistor is changed from 50Ω to 100Ω, for example, the amplitude of the modulation signal SM input to the pad 30c can be increased (or peaked) to the same value as before changing the resistance value in the high-frequency band, even if the driving capability of the DSP 302 is reduced to approximately 78%, for example.

A component size of the carrier 31 is the size that enables a plurality of carriers 31 to be integrated into the optical transmission module 201, with the width L1 of 0.7 mm, and a length L2 of 1.7 mm, for example. The capacitance (earth capacitance) between the inductor 40 on the main surface 31a and the grounding pattern in contact with the back surface 31b can be reduced, by making a thickness L3 of the carrier 31 greater than or equal to 0.45 mm, for example.

Figure 9:
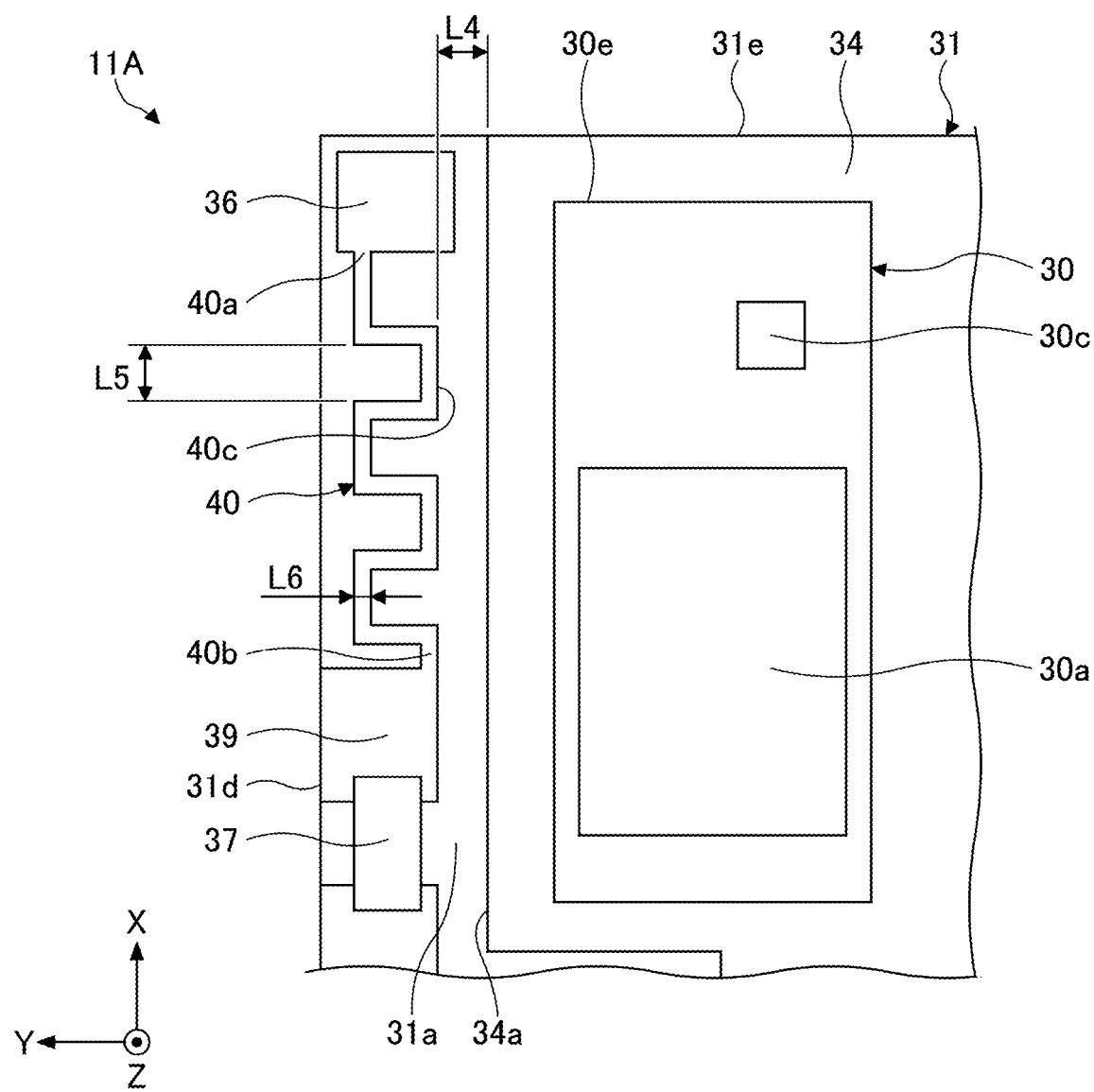
FIG. 9 is a plan view, on a partially enlarged scale, illustrating the example of the configuration of the optical semiconductor device according to the first embodiment.

FIG. 9 is a plan view, on a partially enlarged scale, illustrating a peripheral portion of the semiconductor laser chip 30 in the example of the configuration of the optical semiconductor device according to the first embodiment. The inductance can be increased by increasing the wiring length of the inductor 40, however, the peaking is weakened when an earth capacitance 53 (refer to FIG. 5) is formed between the inductor 40 and the grounding pattern 34. From a viewpoint of reducing the earth capacitance 53, a minimum distance L4 between the inductor 40 and the grounding pattern 34 is preferably 15 μm or greater, more preferably 20 μm or greater, and even more preferably 30 μm or greater. If the minimum distance L4 is less than 15 μm, the earth capacitance 53 increases considerably, and the peaking is reduced due to the increase in the inductance. In addition, if the minimum distance L4 is less than 15 μm, manufacturing variation or inconsistency of the peaking increases, thereby making it difficult to manage or control the frequency characteristics among the individual products. An upper limit of the minimum distance L4 is not particularly limited, but from a viewpoint of securing a mounting area for each component, the minimum distance L4 is preferably ¼ the width L1 along the Y-axis direction of the carrier 31 or less, for example. The minimum distance L4 is preferably 15 μm or greater, also in the case of an inductor 40A and a third bonding wire 54 described below.

The inductor 40 includes a rectangular wave-like undulating portion 40c between the fifth end 40a and the sixth end 40b. The minimum distance L4 corresponds to a distance between the rectangular wave-like undulating portion 40c of the inductor 40 and an outer edge 34a of the grounding pattern 34. The rectangular wave-like undulating portion 40c includes a wiring pattern in the Y-axis direction on both ends of the wiring pattern in the X-axis direction. By providing the wiring pattern in the Y-axis direction, the wiring length of the inductor 40 can be increased. A plurality of undulating wiring patterns are formed by connecting a plurality of patterns in the Y-axis direction and a plurality of patterns in the X-axis direction. The rectangular wave-like undulating portion 40c includes the plurality of undulating wiring patterns. From a viewpoint of reducing the increase in the capacitance between the wiring patterns in the Y-axis direction adjacent to each other in the X-axis direction, a spacing L5 of the rectangular wave-like undulating portion 40c along the X-axis direction is preferably in a range that is 15 μm or greater and 60 μm or less, and more preferably in a range that is 20 μm or greater and 55 μm or less. The spacing L5 corresponds to the distance between adjacent wiring patterns in the Y-axis direction. From a viewpoint of reducing the increase in the earth capacitance 53, a line width L6 of the wiring of the rectangular wave-like undulating portion 40c is preferably in a range that is 5 μm or greater and 30 μm or less, and more preferably in a range that is 10 μm or greater and 25 μm or less.

[Details of Second Embodiment of Present Disclosure]

A specific example of the optical semiconductor device according to a second embodiment of the present disclosure will be described below, with reference to the drawings. In the following, a description of the configuration and effects similar to those of the first embodiment may be omitted or simplified, by incorporating the description given heretofore.

Figure 10:
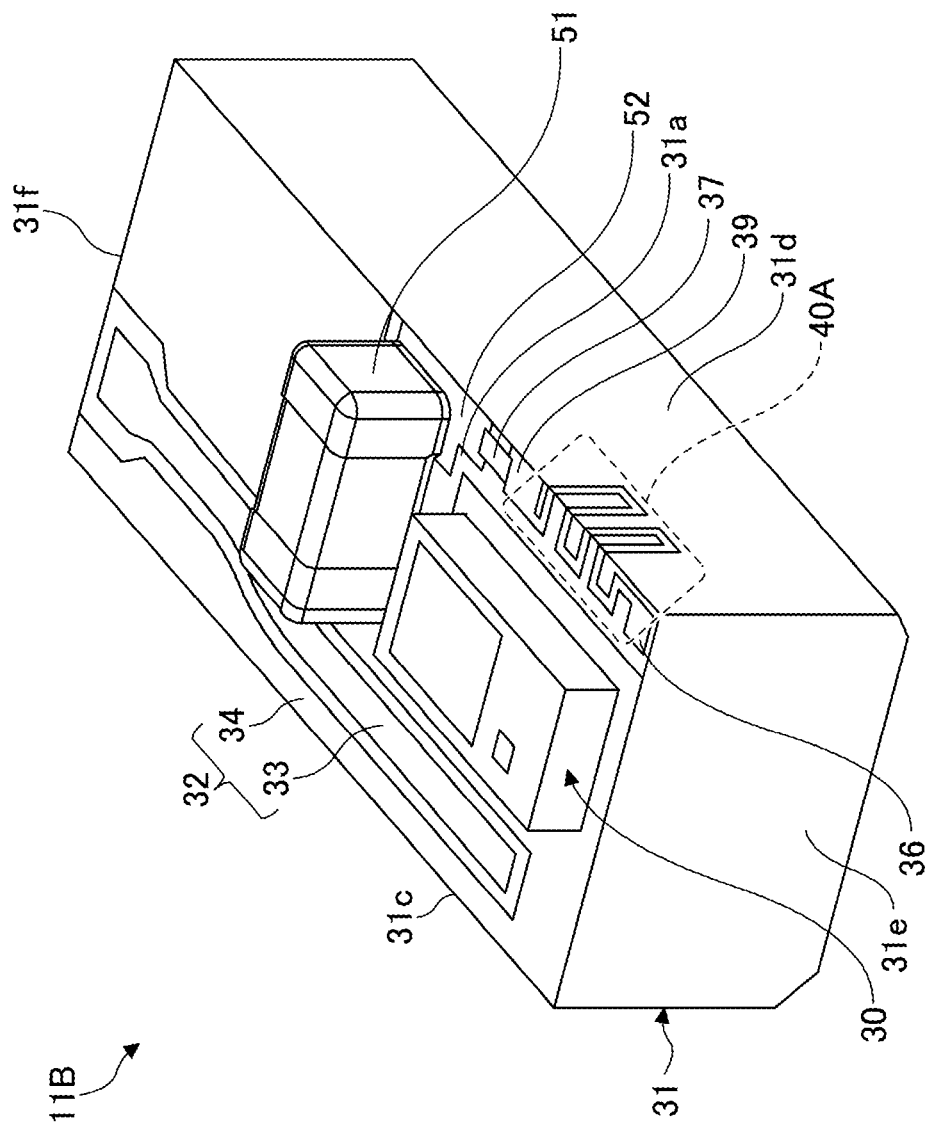
FIG. 10 is a perspective view illustrating an example of the configuration of the optical semiconductor device according to a second embodiment.
Figure 11:
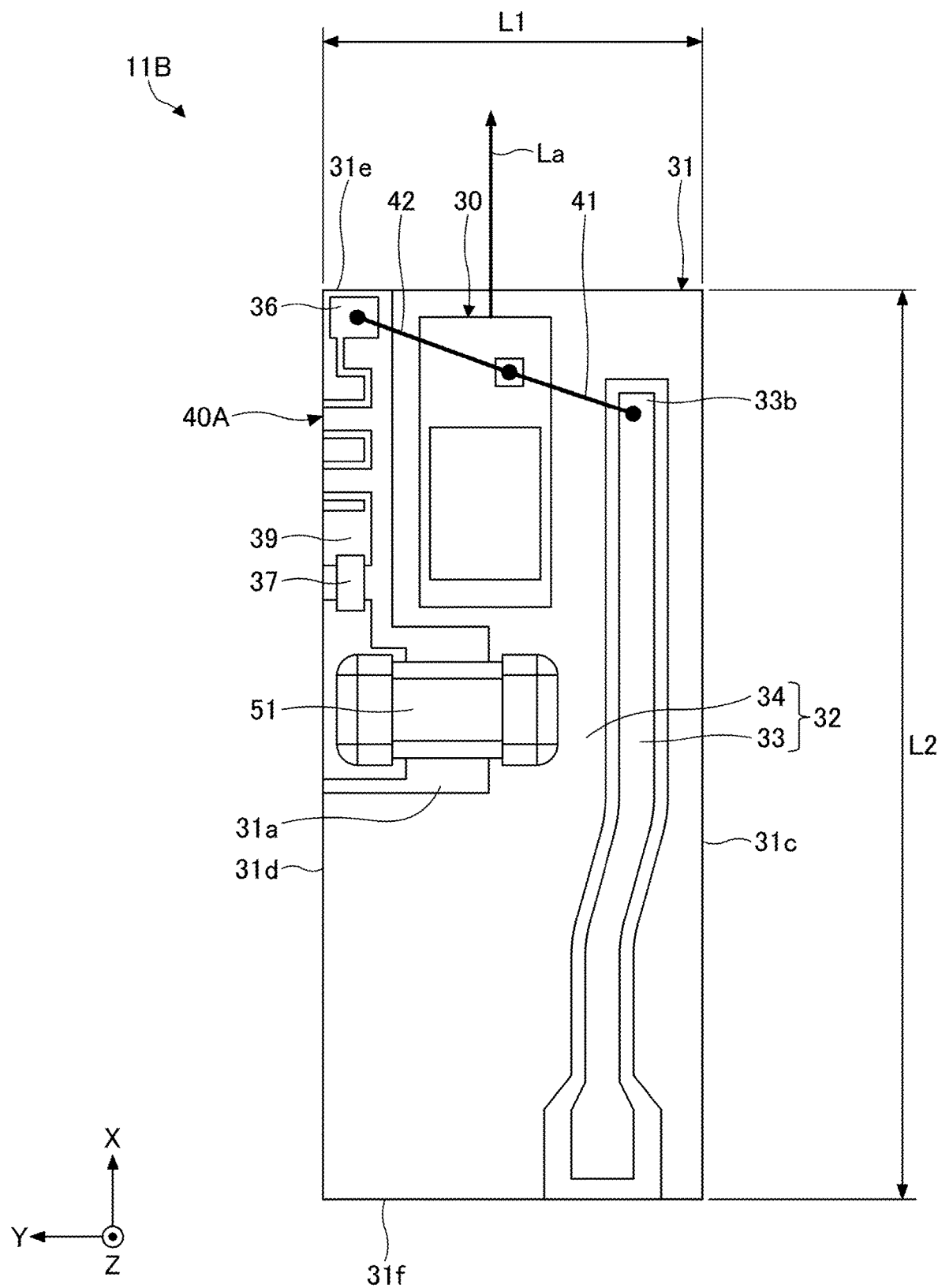
FIG. 11 is a plan view illustrating the example of the configuration of the optical semiconductor device according to the second embodiment.

FIG. 10 is a perspective view illustrating an example of the configuration of the optical semiconductor device according to the second embodiment. FIG. 11 is a plan view illustrating the example of the configuration of the optical semiconductor device according to the second embodiment. An optical semiconductor device 11B illustrated in FIG. 10 and FIG. 11 is an example of the optical semiconductor device 11 described above. The optical semiconductor device 11B differs from the optical semiconductor device 11A in that a portion of the inductor 40A is provided on the side surface 31d of the carrier 31. In FIG. 10 and FIG. 11, the illustration of some components, such as the bonding wires or the like, is omitted.

The side surface 31d is an example of a third surface adjacent to the first surface and the second surface. Because a portion of the inductor 40A is provided on the side surface 31d, the inductance of the connecting wiring between the first pattern 36 and the second pattern 39 can be secured, even if the area sandwiched between the first pattern 36 and the second pattern 39 is relatively narrow. A distance between the wiring pattern provided on the side surface 31d, and the surrounding grounding pattern or grounded conductor, is preferably set greater than or equal to the minimum distance L4 described above.

[Details of Third Embodiment of Present Disclosure]

A specific example of the optical semiconductor device according to a third embodiment of the present disclosure will be described below, with reference to the drawings. In the following, a description of the configuration and effects similar to those of the first embodiment may be omitted or simplified, by incorporating the description given heretofore.

Figure 12:
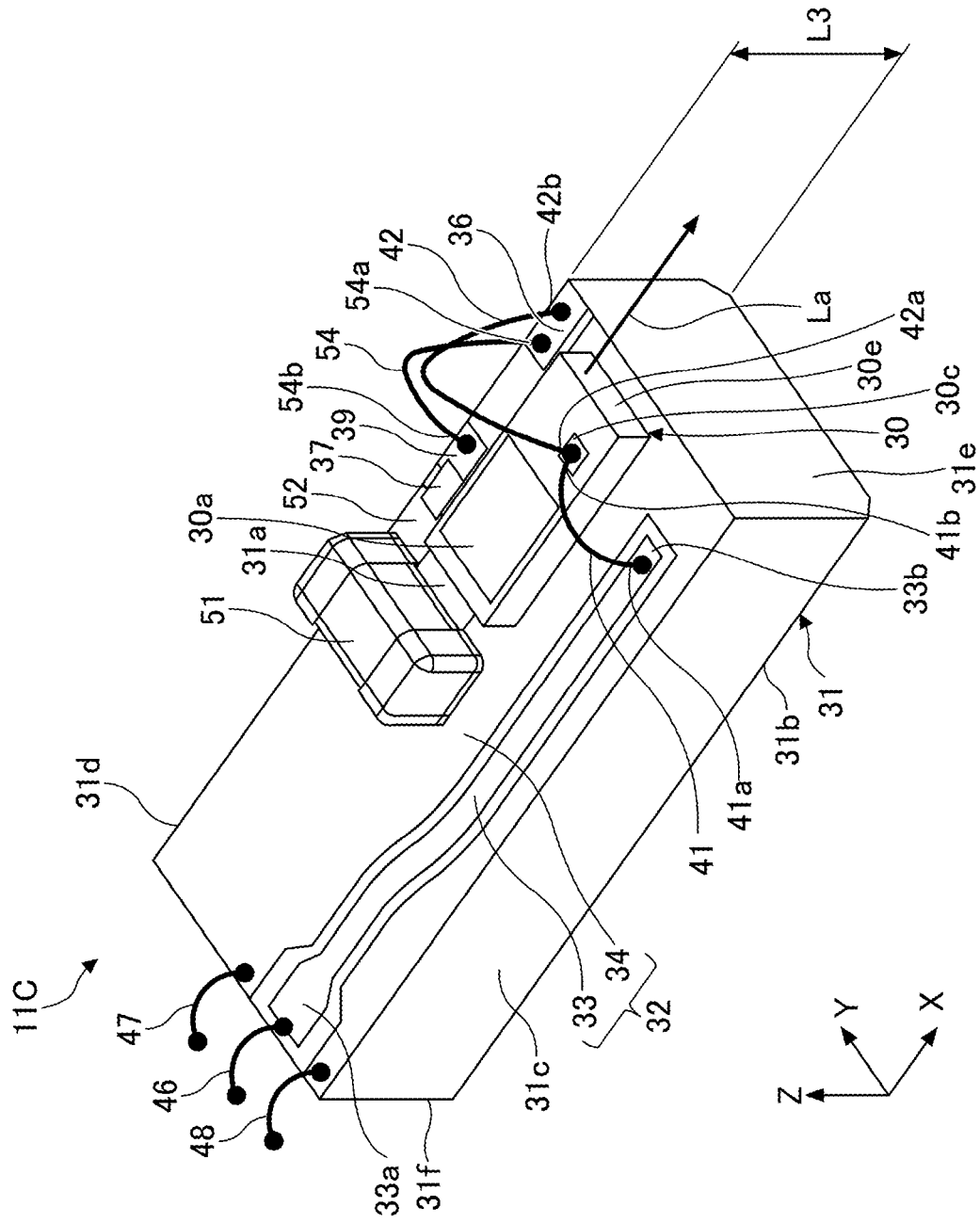
FIG. 12 is a perspective view illustrating an example of the configuration of the optical semiconductor device according to a third embodiment.
Figure 13:
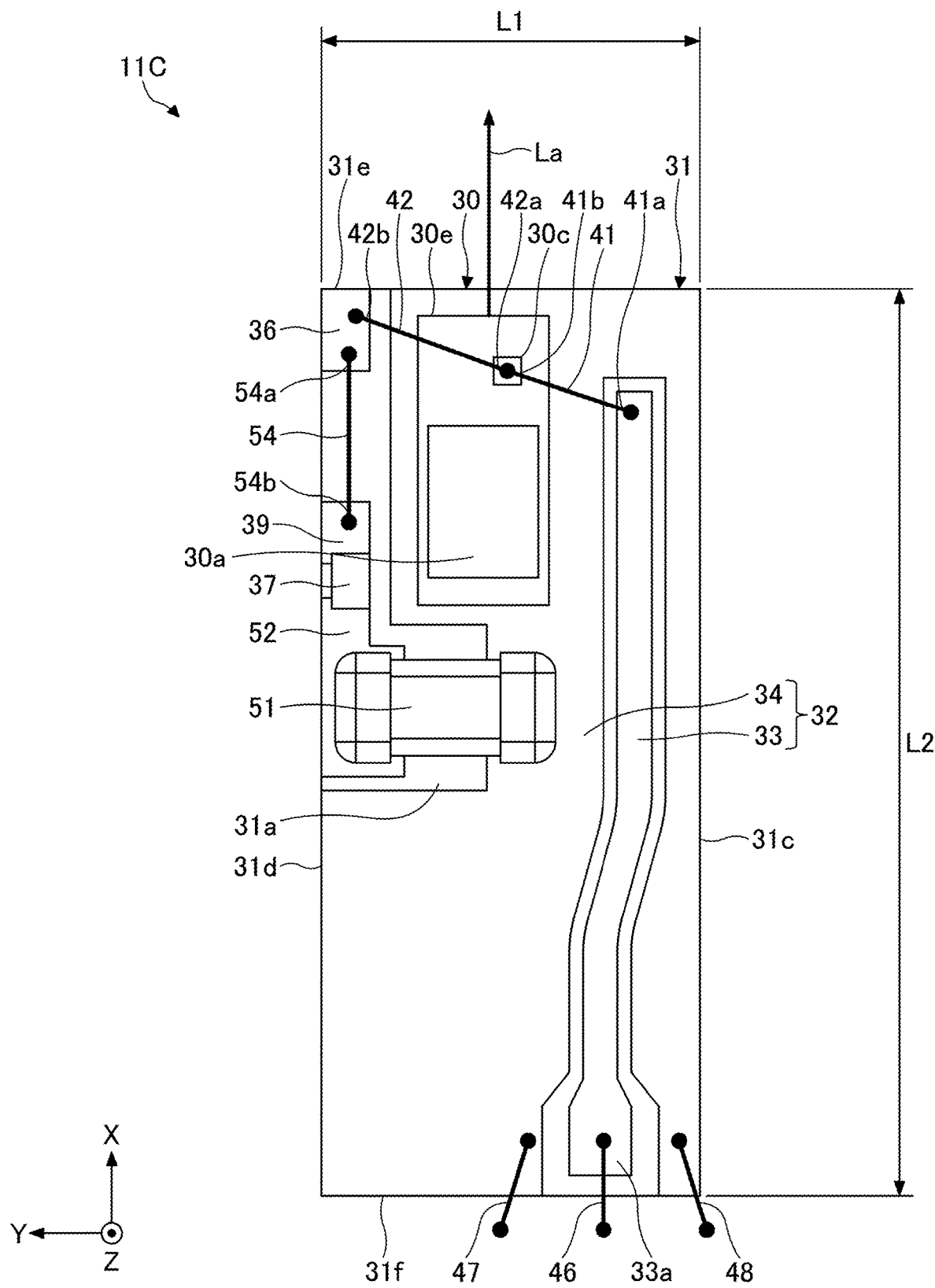
FIG. 13 is a plan view illustrating the example of the configuration of the optical semiconductor device according to the third embodiment.

FIG. 12 is a perspective view illustrating an example of the configuration of the optical semiconductor device according to the third embodiment. FIG. 13 is a plan view illustrating the example of the configuration of the optical semiconductor device according to the third embodiment. An optical semiconductor device 11C illustrated in FIG. 12 and FIG. 13 is an example of the optical semiconductor device 11 described above. The optical semiconductor device 11C differs from the optical semiconductor device 11A in that the inductor inserted between the first pattern 36 and the second pattern 39 is the third bonding wire 54.

The third bonding wire 54 illustrated in FIG. 12 and FIG. 13 includes a wire end 54a electrically connected to the first pattern 36, and a wire end 54b electrically connected to the second pattern 39. For example, the wire bonding device may bond the wire end 54a to the first pattern 36, and the wire end 54b to the second pattern 39. The third bonding wire 54 is an example of an inductor provided on the first surface, the wire end 54a is an example of a fifth end, and the wire end 54b is an example of a sixth end. The third bonding wire 54 extends in the X-axis direction from the first pattern 36 to the second pattern 39. The third bonding wire 54 is a conductive wiring member provided on the main surface 31a, so as to curve in an upward direction (Z-axis direction) above the main surface 31a.

Accordingly, in the optical semiconductor device 11C, the inductance between the second bonding wire 42 and the resistor 37 is increased, by providing the third bonding wire 54 between the second bonding wire 42 and the resistor 37. By employing the third bonding wire 54, a high inductance can be secured between the second bonding wire 42 and the resistor 37, even if the area sandwiched between the first pattern 36 and the second pattern 39 is relatively narrow. Because the inductance between the pad 30c of the semiconductor laser chip 30 and the resistor 37 increases considerably due to the third bonding wire 54, it is possible to increase the intensity (or amplitude) of the modulation signal SM input to the pad 30c of the semiconductor laser chip 30 in the desired high-frequency range. Hence, it is possible to provide a broadband optical semiconductor device 11C, a broadband optical transmission module 201, and a broadband optical transceiver 501, by reducing attenuation in the high-frequency band of the modulation signal SM input to the semiconductor laser chip 30.

[Simulation Results]

Figure 14:
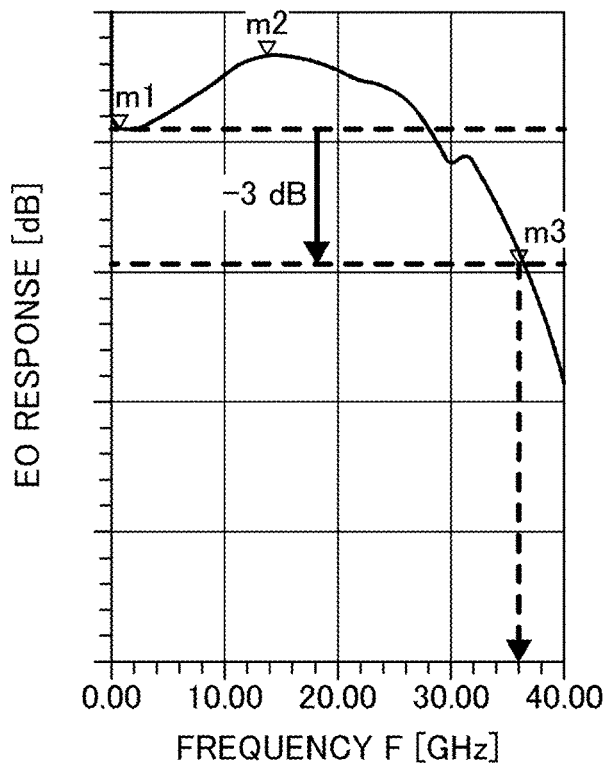
FIG. 14 is a diagram illustrating an example of simulation results (for a case where a resistor is 50Ω) of the optical semiconductor device according to one comparative example.
Figure 15:
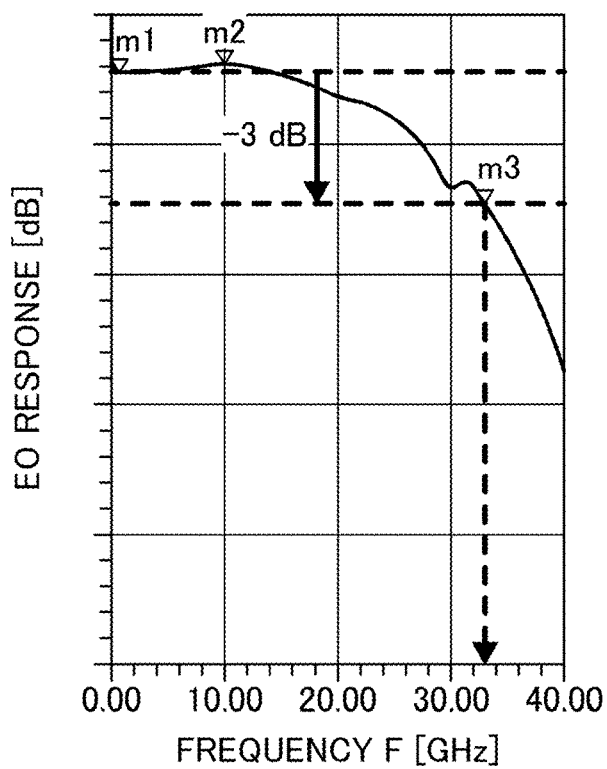
FIG. 15 is a diagram illustrating the example of the simulation results (for a case where the resistor is 75Ω) of the optical semiconductor device according to one comparative example.
Figure 16:
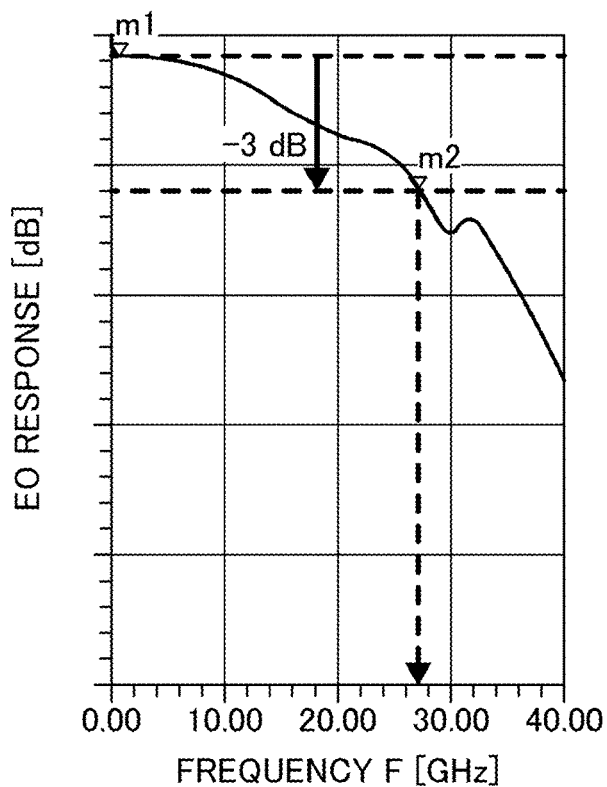
FIG. 16 is a diagram illustrating the example of the simulation results (for a case where the resistor is 100Ω) of the optical semiconductor device according to one comparative example.

FIG. 14, FIG. 15, and FIG. 16 illustrate examples of simulation results for the optical semiconductor device 111 in one comparative example illustrated in FIG. 6, FIG. 7, and FIG. 8, respectively. FIG. 14, FIG. 15, and FIG. 16 respectively illustrate the frequency characteristics of the signal intensity, that is, an Electro-Optic (EO) response, of the optical signal La with respect to the signal intensity of the modulation signal SM input to the input end 33a. The EO response represents a ratio of the signal intensity of optical signal La with respect to the signal intensity of the modulation signal SM. A value of the EO response is expressed in decibels (dB) in FIG. 14, FIG. 15, and FIG. 16. The value of the EO response may be calculated based on the signal intensity of the optical signal La at a frequency F=0 Hz. FIG. 14, FIG. 15, and FIG. 16 illustrate the simulation results for cases where the resistance value of the resistor 37 is 50 Ω, 75Ω, and 100 Ω, respectively. The abscissa indicates the frequency F of the modulation signal SM input to the input end 33a, and the ordinate indicates the EO response. In the frequency characteristics of the EO response, the lower the position along the ordinate, the greater the loss (conversion loss) during the conversion of the modulation signal SM into the optical signal La. In FIG. 14, a curve (solid line) indicating the frequency characteristics crosses a dashed line parallel to the abscissa, indicating a value which is decreased by approximately −3 dB from a value when the frequency F is 1 GHz, at a point m3. The frequency F at this point m3 may also be referred to as a 3 dB-band. Similarly, in FIG. 15, the frequency F at the point m3 is the 3 dB-band. In FIG. 16, there is no point m3, and the frequency F at a point m2 is the 3 dB-band. Further, in the simulation results illustrated in FIG. 14, FIG. 15, and FIG. 16, the wiring length of the second bonding wire 42 is set to 670 μm, and the inductance at the terminating end is set to 618 pH@30 GHz (=329 pH (second bonding wire 42)+289 pH (4 connecting wirings).

As the resistance value of the resistor 37 is increased to 50Ω (refer to FIG. 14), 75Ω (refer to FIG. 15), and 100Ω (refer to FIG. 16), the peaking (increasing effect) of the frequency characteristics deteriorates, and the degree of decrease in the EO response with increasing frequency F increases. For example, when the resistance value of the resistor 37 is set to 50Ω (refer to FIG. 14), the peaking is observed at the point m2, and the 3 dB-band is 36 GHz. However, when the resistance value of the resistor 37 is increased to 100Ω (refer to FIG. 16), the peaking is no longer observed, and the 3 dB-band decreases to 27 GHz.

Figure 17:
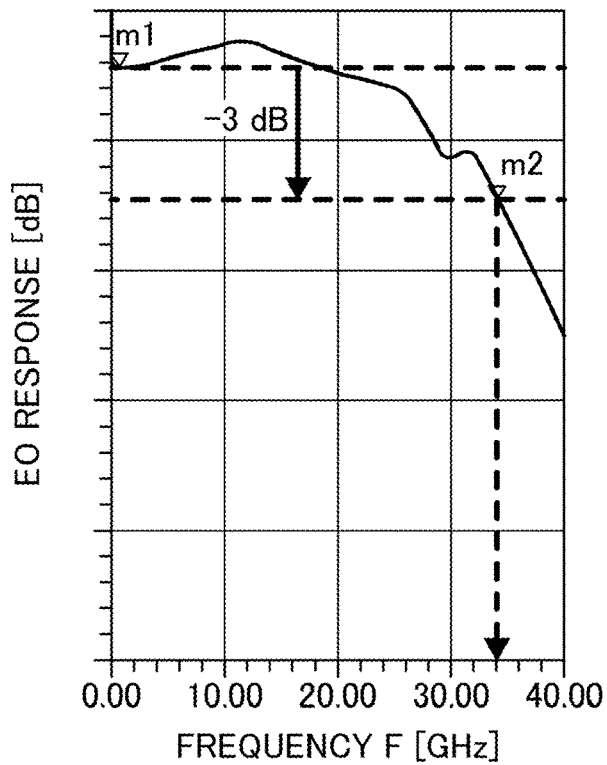
FIG. 17 is a diagram illustrating an example of the simulation results (for the case where the resistor is 75Ω) of the optical semiconductor device according to the first embodiment.
Figure 18:
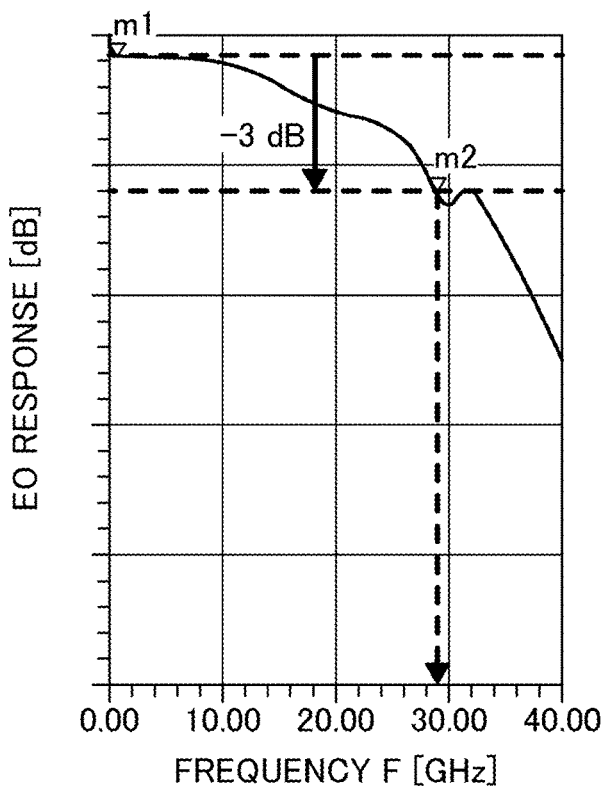
FIG. 18 is a diagram illustrating the example of the simulation results (for the case where the resistor is 100Ω) of the optical semiconductor device according to the first embodiment.

On the other hand, FIG. 17 and FIG. 18 illustrate examples of the simulation results for the optical semiconductor device 11A according to the first embodiment illustrated in FIG. 3, FIG. 4, and FIG. 5, respectively. FIG. 17 and FIG. 18 respectively illustrate the frequency characteristics of the signal intensity, that is, the Electro-Optic (EO) response, of the optical signal La with respect to the signal intensity of the modulation signal SM input to the input end 33a. The value of the EO response is expressed similarly to FIG. 14, FIG. 15, and FIG. 16. FIG. 17 and FIG. 18 illustrate cases where the resistance value of the resistor 37 is 75 Ω and 100Ω, respectively. In the simulation results illustrated in FIG. 17 and FIG. 18, the wiring length of the second bonding wire 42 is set to 670 μm (same as in FIG. 15 and FIG. 16), and the inductance at the terminating end is set to 730 pH@30 GHz (=329 pH (second bonding wire 42)+401 pH (inductor 40)).

When the resistance value of the resistor 37 is 75Ω, FIG. 17 has a higher peaking effect than FIG. 15, and a −3 dB-band extends to the high-frequency side. When the resistance value of the resistor 37 is 100Ω, FIG. 18 has a −3 dB-band extending to the high-frequency side when compared to FIG. 16. Thus, by employing the inductor 40 as the terminating inductor, the inductance between the pad 30c of the semiconductor laser chip 30 and the resistor 37 can be increased, thereby enabling a broadband optical semiconductor device, a broadband optical transmission module, and a broadband optical transceiver to be provided.

Figure 19:
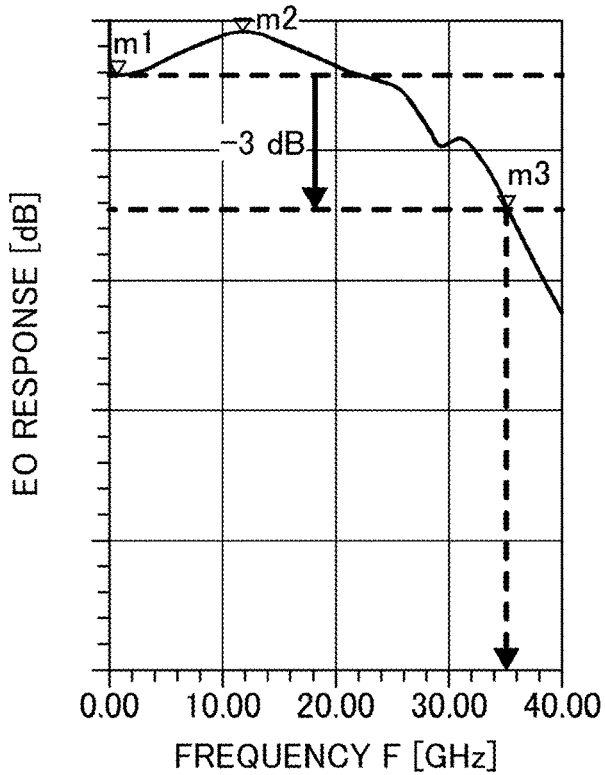
FIG. 19 is a diagram illustrating the example of the simulation results (for a case where the resistor is 75Ω, and a second wire bonding is lengthened) of the optical semiconductor device according to the first embodiment.
Figure 20:
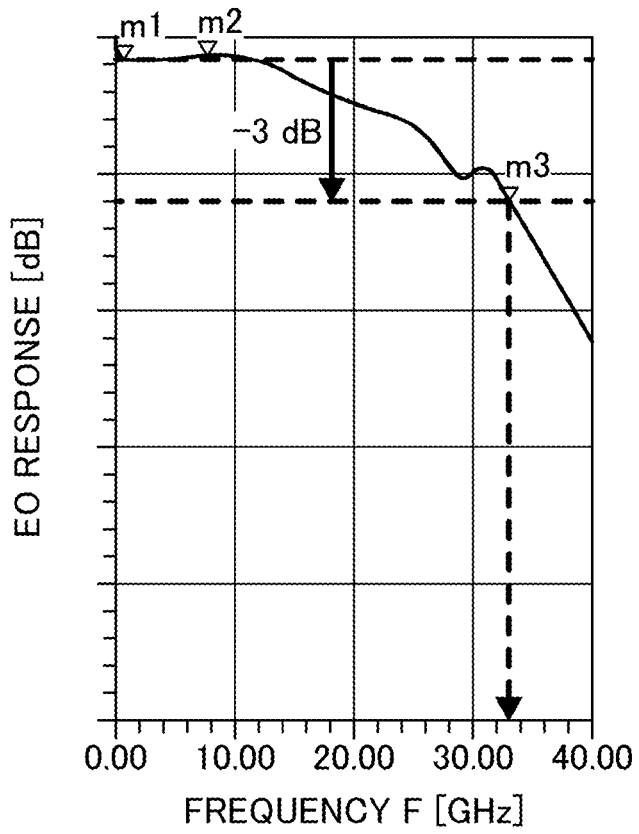
FIG. 20 is a diagram illustrating the example of the simulation results (for a case where the resistor is 100Ω and the second wire bonding is lengthened) of the optical semiconductor device according to the first embodiment.

FIG. 19 and FIG. 20 also illustrate examples of the simulation results for the optical semiconductor device 11A according to the first embodiment illustrated in FIG. 3, FIG. 4, and FIG. 5, respectively. FIG. 19 and FIG. 20 illustrate cases where the resistance value of the resistor 37 is 75Ω and 100Ω, respectively. The wiring length of the second bonding wire 42 is set to 1200 μm, and the inductance at the terminating end is set to 101 pH@30 GHz (=600 pH (second bonding wire 42)+401 pH (inductor 40)).

When the resistance value of the resistor 37 is 75Ω, FIG. 19 has a higher peaking effect and the −3 dB-band extends to the high-frequency side, when compared to FIG. 15. When the resistance value of the resistor 37 is 100Ω, FIG. 20 has a higher peaking effect and the −3 dB-band extends to the high-frequency side, when compared to FIG. 16. As described above, by employing the inductor 40 as the inductor at the terminating end, and extending the second bonding wire 42 (increasing the inductance of the second bonding wire 42), the inductance at the terminating end can be increased, thereby enabling a broadband optical semiconductor device, a broadband optical transmission module, and a broadband optical transceiver to be provided.

Hence, according to the embodiments of the present disclosure described above, it is possible to reduce attenuation in the high-frequency range of the electrical signal input to the semiconductor laser chip.

While the embodiments have been described, it will be understood that various variations, modifications, and substitutions may be made without departing from the spirit and scope of the present disclosure. Hence, combinations and substitutions of a part or all of each embodiment with another embodiment may be made, as appropriate.

For example, an interconnect pattern that transmits the electrical signal input to the input end 33a to the output end 33b via the wiring pattern 33 is not limited to the coplanar strip, and other transmission lines, such as microstrips, microstrip lines, or the like, may be used.

What is claimed is:

1. An optical semiconductor device comprising:
an insulative base having a first surface and a second surface, the first surface being parallel to a first direction which extends along a longitudinal direction of the insulative base, the second surface crossing the first direction, the insulative base including a metallic pattern formed on the first surface, the metallic pattern including
a grounding pattern configured to be grounded,
a transmission pattern having an input end, an output end, and a line extending along the first direction from the input end to the output end, the line being electrically connected between the input end and the output end,
a first pattern, and
a second pattern,
wherein the first pattern is located between the second surface and the second pattern;
a semiconductor laser chip mounted on the first surface, the semiconductor laser chip having an electrode, and an emitting end located between the electrode and the second surface, the semiconductor laser chip being configured to emit an optical signal from the emitting end according to an electrical signal input to the electrode, the semiconductor laser chip being located between the transmission pattern and two patterns formed by the first pattern and the second pattern, respectively;
a first wire electrically connecting the output end of the transmission pattern to the electrode;
a second wire electrically connecting the electrode of the semiconductor laser chip to the first pattern;
a resistor provided on the first surface;
an inductor provided on the first surface and electrically connected between the second wire and the resistor, the inductor being electrically connected between the first pattern and the second pattern, the inductor being formed by a meander wiring or a bonding wire; and
a capacitor provided on the first surface,
wherein the resistor is electrically connected between the second pattern and the capacitor, and
wherein the capacitor is electrically connected between the resistor and the grounding pattern.

2. The optical semiconductor device as claimed in claim 1, wherein
the resistor has a resistance value greater than a value of a characteristic impedance of the transmission pattern, and
the transmission pattern is surrounded by the grounding pattern.

3. The optical semiconductor device as claimed in claim 1, wherein the insulative base has a distance between the first pattern and the second surface, which is less than a distance between the electrode and the second surface.

4. The optical semiconductor device as claimed in claim 3, wherein the distance between the electrode and the second surface is less than a distance between the output end and the second surface.

5. The optical semiconductor device as claimed in claim 4, wherein the first pattern, the electrode, and the output end are linearly aligned in a plan view of the first surface.

6. The optical semiconductor device as claimed in claim 1, wherein
the insulative base has a third surface adjacent to the first surface and the second surface, and
the inductor formed by the meander wiring includes a portion provided on the third surface.

7. The optical semiconductor device as claimed in claim 1, wherein the optical semiconductor device has a minimum distance between the inductor and the grounding pattern, which is greater than or equal to 15 μm.

8. The optical semiconductor device as claimed in claim 7, wherein the transmission pattern is a coplanar strip with a gap between the grounding pattern and the line.

9. An optical transmission module comprising:
the optical semiconductor device according to claim 1; and
an optical system configured to receive the optical signal and output an optical signal corresponding to the input optical signal.

10. An optical transceiver comprising:
    an optical transmission module having the optical semiconductor device according to claim 1;
    an optical reception module configured to convert an optical signal input from an external source into a received signal; and
    a signal processing circuit configured to supply the electrical signal to the input end and process the received signal.

11. The optical semiconductor device as claimed in claim 1, wherein
    the first surface and the second surface are perpendicular to each other, and
    the semiconductor laser chip is configured to emit the optical signal from the emitting end in the first direction.

12. The optical transmission module as claimed in claim 9, wherein
    the first surface and the second surface are perpendicular to each other, and
    the optical semiconductor device is configured to emit the optical signal from the emitting end in the first direction.

13. The optical transmission module as claimed in claim 9, wherein
    the first surface and the second surface are perpendicular to each other, and
    the semiconductor laser chip is configured to emit the optical signal from the emitting end in the first direction.

14. The optical transceiver as claimed in claim 10, wherein
    the first surface and the second surface are perpendicular to each other, and
    the optical transmission module is configured to emit the optical signal from the emitting end in the first direction.

15. The optical transceiver as claimed in claim 10, wherein
    the first surface and the second surface are perpendicular to each other, and
    the optical semiconductor device is configured to emit the optical signal from the emitting end in the first direction.

16. The optical transceiver as claimed in claim 10, wherein
    the first surface and the second surface are perpendicular to each other, and
    the semiconductor laser chip is configured to emit the optical signal from the emitting end in the first direction.

* * * * *